(12) United States Patent
D'Alto et al.

(10) Patent No.: US 11,024,182 B2
(45) Date of Patent: Jun. 1, 2021

(54) SYSTEM AND METHOD TO FORECAST FLIGHT DELAY BASED ON REAL-TIME DATA

(71) Applicant: The Boeing Company, Chicago, IL (US)

(72) Inventors: Luis D'Alto, Madrid (ES); Alicia Grech, Heusenstamm (DE); Javier Lopez Leones, Majadahonda (ES); Andrés Muñoz Hernández, Munich (DE); Miguel Vilaplana, Madrid (ES); Anthony Weatherington, Acworth, GA (US)

(73) Assignee: The Boeing Company, Chicago, IL (US)

( * ) Notice: Subject to any disclaimer, the term of this patent is extended or adjusted under 35 U.S.C. 154(b) by 242 days.

(21) Appl. No.: 16/221,938

(22) Filed: Dec. 17, 2018

(65) Prior Publication Data

US 2020/0193841 A1   Jun. 18, 2020

(51) Int. Cl.
*G08G 5/00* (2006.01)
*G06F 16/9035* (2019.01)
*G06F 30/20* (2020.01)

(52) U.S. Cl.
CPC ......... *G08G 5/003* (2013.01); *G06F 16/9035* (2019.01); *G06F 30/20* (2020.01);
(Continued)

(58) Field of Classification Search
CPC ...... G08G 5/003; G08G 5/006; G08G 5/0082; G08G 5/0091; G08G 5/0013;
(Continued)

(56) References Cited

U.S. PATENT DOCUMENTS 6,278,965 B1 * 8/2001 Glass ............... G06Q 10/025
  701/120
8,554,457 B2 * 10/2013 White ............... G08G 5/065
  701/120

(Continued)

OTHER PUBLICATIONS

A. Gardi, R. Sabatini, S. Ramasamy and T. Kistan, Real-Time Trajectory Optimisation Models for Next Generation Air Traffic (2014).

(Continued)

*Primary Examiner* — Russell Frejd
(74) *Attorney, Agent, or Firm* — Parsons Behle & Latimer

(57) ABSTRACT

A method may include receiving flight plan data representing a set of current flight plans and receiving surveillance data representing a set of current aircraft statuses. The method may further include generating merged data representing a set of flight portions that remain to be flown. The method may also include receiving operational context data representing airspace configurations, airport configurations, or a combination thereof, and receiving weather data. The method may include generating predicted flight traffic data by performing a simulation of flights over a duration of time, the simulation based at least partially on the merged data, the operational context data, and the weather data. The method may further include generating a user output based at least partially on the predicted flight traffic data.

20 Claims, 8 Drawing Sheets

(52) U.S. Cl.
CPC ........... *G08G 5/006* (2013.01); *G08G 5/0013* (2013.01); *G08G 5/0026* (2013.01); *G08G 5/0043* (2013.01); *G08G 5/0073* (2013.01); *G08G 5/0082* (2013.01); *G08G 5/0091* (2013.01)

(58) Field of Classification Search
CPC .. G08G 5/0026; G08G 5/0043; G08G 5/0073; G06F 16/9035; G06F 30/20
See application file for complete search history.

(56) References Cited

U.S. PATENT DOCUMENTS 9,171,476 B2 * 10/2015 White .................. G08G 5/06
9,558,670 B1 * 1/2017 Sheth .................. G01C 21/005

OTHER PUBLICATIONS

European Patent Office; Extended European Search Report; Patent Application No. 19212273.7 dated May 13, 2020.

* cited by examiner

SYSTEM AND METHOD TO FORECAST FLIGHT DELAY BASED ON REAL-TIME DATA

FIELD OF THE DISCLOSURE

This disclosure is generally related to forecasting flight traffic, and in particular, to using real-time data to forecast flight delay.

BACKGROUND

As air traffic around the world increases, there is a need in the air traffic management and control environments to use air navigation systems more efficiently, and thereby reduce delay and congestion. Having an accurate prediction of near-future air traffic delay may help identify areas and actors that may help balance the capacity offered by air traffic regulators, air navigation service providers, and airports with the capacity required by the incoming air traffic. Typical airlines would be interested to know the near-future situation of the air traffic and the interactions the traffic may have with airports, airspaces and other airlines. For example, Europe Air Navigation Service Providers (ANSPs) may not be aware of incoming traffic until about 90 minutes before the aircraft enters its airspace, when that traffic is coming from outside the European Civil Aviation Conference (ECAC) area.

Traditional systems to predict delay in real-time may rely on historical data with some real-time information extracted from ANSPs service providers, such as actual time of departure or flight plans. This real-time information is used in very simple kinematics algorithms that propagate the information in the flight plans to obtain estimated time of arrival, and therefore the expected delay for those flights. Mathematical models have been proposed that try to link certain precursors of delay with some elements that can be observed from a flight (e.g., city pairs, weather, etc.). These models use different machine learning techniques to train prediction models.

Typical solutions may lack accuracy and realisms of delay figures. Many interactions that contribute to air traffic timing and delay (e.g., sectors, terminal control areas, holdings, runway configurations, etc.) are not considered in typical models because they are traditionally outside the purview of air traffic management systems. In some cases, typical solutions are only reliable to determine if a delay would be higher than certain threshold (typically 60 minutes). Air traffic fast time simulators have been traditionally used as a method for analyzing delay figures historically. However, current commercial air traffic simulators are designed to be used offline, during strategic or pre-tactical planning phases and also post operations. These typical simulators are not equipped to work with real-time information feeders. Other disadvantages may exist.

SUMMARY

Disclosed herein is a system and method for forecasting airport delays based on flight data and ground data. The system and method may enable a fast time simulator to be used as a near-future state prediction engine. The system may combine sources of data, as well as the flight plans, of all flights in a designated area to algorithmically calculate predicted flight traffic. The data may be used to determine delays and may use the forecasted delays to provide recommendations to alleviate the delays. The system may collect and merge real-time information from different feeders in order to provide an accurate forecast of the traffic status.

In an embodiment, a method includes receiving flight plan data representing a set of current flight plans. The method further includes receiving surveillance data representing a set of current aircraft statuses. The method also includes generating merged data representing a set of flight portions that remain to be flown, where the merged data is generated by pairing individual aircraft statuses with individual flight plans, by correcting the individual flight plans based on the individual aircraft statuses to generate corrected flight plans, and by determining portions of the corrected flight plans that remain to be flown. The method includes receiving operational context data representing airspace configurations, airport configurations, or a combination thereof. The method further includes receiving weather data. The method also includes generating predicted flight traffic data by performing a simulation of flights over a duration of time, where the simulation is based at least partially on the merged data, the operational context data, and the weather data. The method also includes generating a user output based at least partially on the predicted flight traffic data.

In some embodiments, the method includes receiving user input indicating the duration of time and an area of interest, and filtering the set of current flight plans based on the duration of time and based on the area of interest. In some embodiments, the area of interest is associated with an airport terminal, with an airport, with multiple airports, or with a geographical region. In some embodiments, each flight plan of the set of flight plans includes an indication of a route to be followed, an aircraft type, an origin-destination pair, an estimated time of departure, an estimated time of arrival, or any combinations thereof. In some embodiments, the surveillance data includes automatic dependent surveillance-broadcast (ADS-B) reports. In some embodiments, the method includes storing at least one ADS-B report, and calculating a flight trajectory based on the ADS-B report, where at least one of the corrected flight plans is based on the flight trajectory. In some embodiments, the method includes formatting the weather data to be compatible with an architecture of the simulation. In some embodiments, the weather data is formatted as a weather information file, the operational context data is formatted as a waypoints and navigational aid file, an airports file, or both, and the merged data is formatted as a flight schedule file. In some embodiments, the simulation is performed using a fast time simulation tool. In some embodiments, the user output includes a predicted average delay for the area of interest at a time within the duration of time, a recommended action to reduce the predicted average delay, or both.

In an embodiment, a system includes at least one processor and at least one memory storing instructions that, when executed by the processor, cause the at least one processor to receive flight plan data representing a set of current flight plans. The instructions further cause the at least one processor to receive surveillance data representing a set of current aircraft statuses. The instructions also cause the at least one processor to generate merged data representing a set of flight portions that remain to be flown, the merged data generated by pairing individual aircraft statuses with individual flight plans, by correcting the individual flight plans based on the individual aircraft statuses to generate corrected flight plans, and by determining portions of the corrected flight plans that remain to be flown. The instructions also cause the at least one processor to send the merged data to a simulator module.

In some embodiments, the instructions cause the processor to receive operational context data representing airspace configurations, airport configurations, or a combination thereof, to receive weather data, and to send the operational context data and the weather data to the simulator module. In some embodiments, the simulator module is configured to generate predicted flight traffic data by performing a simulation of flights for a duration of time, where the simulation is based at least partially on the merged data, the operational context data, and the weather data, and is configured to output at least a portion of the predicted flight traffic data to an output device. In some embodiments, the instructions further cause the processor to receive user input indicating a duration of time and an area of interest, and to filter the set of current flight plans based on the duration of time and based on the area of interest. In some embodiments, the instructions also cause the processor to store at least one ADS-B report at the memory, and to calculate a flight trajectory based on the ADS-B report, where at least one of the corrected flight plans is based on the flight trajectory. In some embodiments, the instructions further cause the processor to format the weather data to be compatible with an architecture of the simulator module.

In an embodiment, a method includes receiving flight plan data representing a set of current flight plans. The method further includes receiving surveillance data representing a set of current aircraft statuses. The method also includes generating merged data representing a set of flight portions that remain to be flown based on the flight plan data and based on the surveillance data. The method includes receiving operational context data representing an airspace configuration, an airport configuration, or a combination thereof. The method further includes receiving weather data. The method also includes iteratively changing a parameter of the operational context data and, for each iteration, calculating predicted delays for a set of flights by performing multiple simulations of the flights over a duration of time, the multiple simulations based at least partially on the merged data, the operational context data, and the weather data. The method includes identifying a recommendation associated with the parameter to reduce the predicted delays based on the multiple simulations.

In some embodiments, the method includes receiving user input indicating the duration of time and an area of interest, and filtering the set of current flight plans based on the duration of time and based on the area of interest. In some embodiments, the area of interest is associated with an airport terminal, with an airport, with multiple airports, or with a geographical region. In some embodiments, the method includes generating a user output including a predicted average delay for the area of interest at a time within the duration of time.

Figure 1:
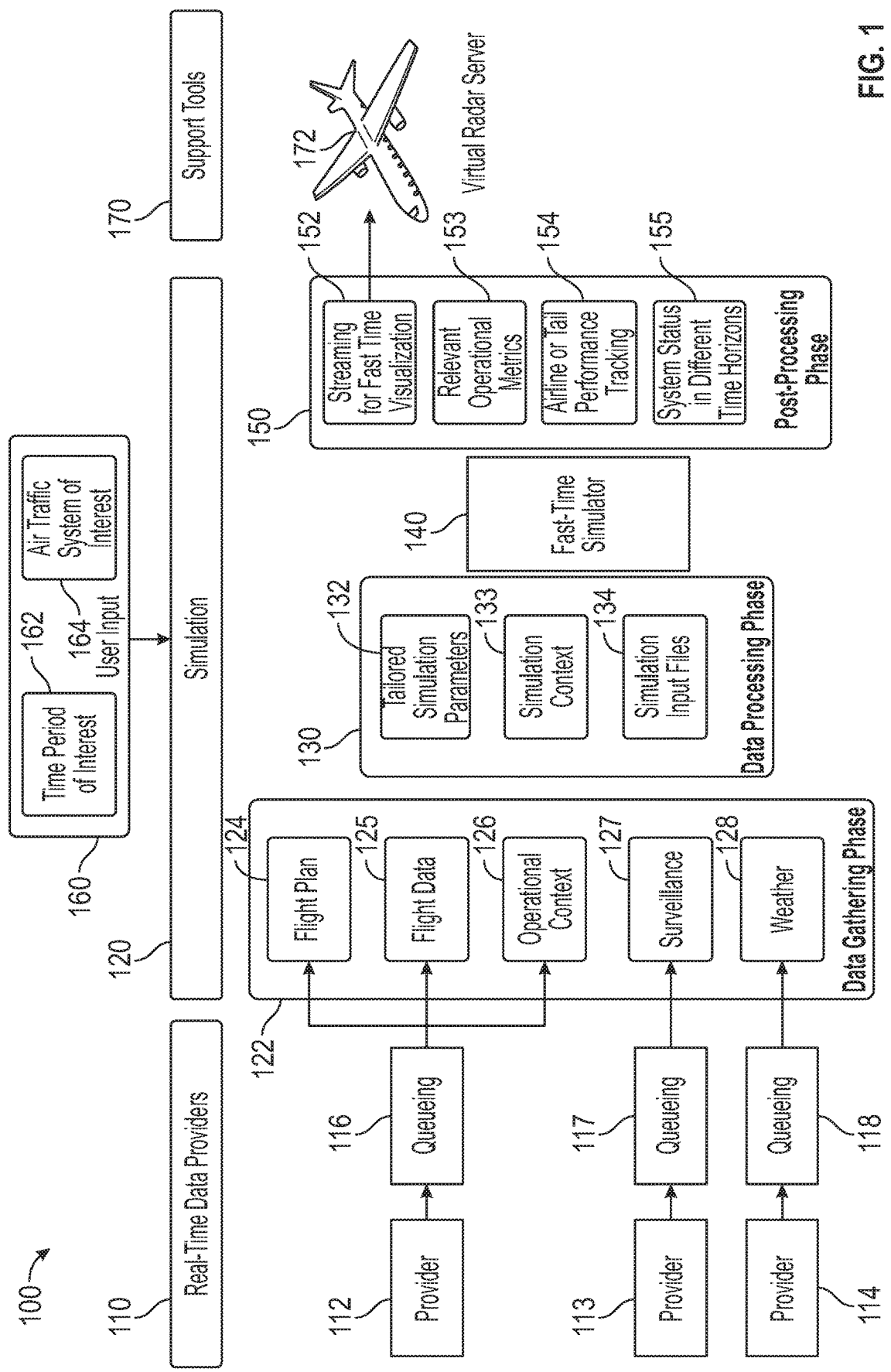
FIG. 1 is a block diagram depicting an embodiment of an overall system for forecasting flight traffic.

While the disclosure is susceptible to various modifications and alternative forms, specific embodiments have been shown by way of example in the drawings and will be described in detail herein. However, it should be understood that the disclosure is not intended to be limited to the particular forms disclosed. Rather, the intention is to cover all modifications, equivalents and alternatives falling within the scope of the disclosure.

DETAILED DESCRIPTION

Referring to FIG. 1, an embodiment of an overall system 100 for forecasting flight traffic is depicted. The system 100 may include real-time data providers 110, a simulation system 120, and associated support tools 170.

The real-time data providers 110 may provide real-time data to the simulation system 120. For example, a first provider 112 may provide flight plan data 124, flight data 125, and operational context data 126. A second provider 113 may provide surveillance data. A third data provider 114 may provide weather data. It should be noted that this particular configuration is for example purposes only. Other combinations including other providers may exist. Examples of data providers may include ADS-B providers such as Flight Radar 24 or FlightAware, central flow flight plan collectors such as Eurocontrol's Network Manager or an airline operation center, weather services such as the National Oceanic and Atmosphere Administration Operational Model Archive and Distribution System (NOMADS), and the like.

The providers 112-114 may be associated with respective queueing structures 116-118. For example, the first provider 112 may be associated with a first queuing structure 116, the second provider 113 may be associated with a second queueing structure 117, and the third data provider 114 may be associated with a third queueing structure 118. The queueing structures 116-118 may include devices and protocols for formatting, organizing, queueing, and streaming real-time data. For example, the queueing structures 116-118 may be implemented using Advanced Message Queueing Protocol (AMQP), Apache Kafka, other messaging and streaming platforms, or combinations thereof.

Simulations at the simulation system 120 may occur in phases. During a data gathering phase 122, the flight plan data 124, the flight data 125, the operational context data 126, the surveillance data 127, and the weather data 128 may be received and organized.

The flight plan data 124 may represent a set of current flight plans. As used herein, the term "current" means that the flight plans are associated with flights that have not yet been completed, as opposed to "historical" data, which is associated with flights that have already been completed. The flight plan data 124 may be used as a baseline element to provide general information about all of the current flights in an air traffic system of interest 164 during a time period of interest 162. The objective of obtaining the flight plan data 124 is to provide the information necessary to correctly simulate all the relevant flights during a specified time period of interest 162. The flight plan data 124 may include, for each flight plan, an indication of a route to be followed, an aircraft type, an origin-destination pair, an estimated time of departure, an estimated time of arrival, or any combinations thereof.

The flight data 125 may include in-flight updates. It may be similar to the surveillance data 127, but may be reported at different intervals. The flight data may provide 4D position updates of aircraft. In some cases, the flight data 125 may be used when the surveillance data 127 is unavailable.

The operational context data 126 may include relevant information about the airspace and airport environments within the air traffic system of interest 164. It may take the form of the aeronautical information exchange model (AIXM). As such, the operational context data 126 may include information regarding airport area data, airspace structures, organizations and units, points and navigation aids, procedures, routes and flying restrictions information for building waypoints, runway configurations, airport information, and route information, which may be useful for performing an accurate simulation of the airspace systems.

The surveillance data 127 may include observed flight traffic data such as radar information or automatic dependent surveillance-broadcast (ADS-B) reports. As such, the surveillance data 127 may represent a set of current aircraft statuses. As with the flight plan data 124, the term "current" means that the statuses are associated with flights that have not yet been completed. The objective of obtaining the surveillance data 127 is to determine a starting status of each aircraft to be simulated. Additionally, the surveillance data 127 can be recorded and stored during the time period of interest 162 and may be used to calibrate trajectory computation.

The weather data 128 may provide weather (e.g., wind) information useful for calculating an aircraft trajectory. For example, whether may influence on the speed and development of flights.

After the data gathering phase 122, a data processing phase 130 may be performed. User input 160 may be received, and may include the time period of interest 162 and the air traffic system of interest 164. The time period of interest 162 may include a start time, which in real-time applications, will generally be within a threshold of the time at which the simulation is executed. The threshold may depend on factors such as a reporting frequency of the real-time data providers 110 and other factors (e.g., technology limitations) that may cause delay in the system 100. The time period of interest 162 may also include a time horizon, or duration of time, that is to be simulated. The air traffic system of interest 164 may include an area of interest, which may correspond to different spatial scales, such as an airport or a network of airports in a country, in a continent, etc.

The data processing phase 130 may generate tailored simulation parameters 132, a simulation context 133, and simulation input files 134. In order to generate the tailored simulation parameters 132, the data 124-128 may be filtered according to the time period of interest 162 and according to the air traffic system of interest 164. This may limit the simulation to those flights that are active within the air traffic system of interest 164.

Individual flights from the flight plan data 124 may be correlated with the surveillance data 127. The flight plan data 124 may be corrected, based on the surveillance data 127 using a trajectory intercept routine. The process may include determining a point in an individual flight plan at which a particular data point (e.g., an ADS-B report) from the surveillance data 127 fits, and keeping the part of the flight plan the aircraft still needs to fly. This merged data may replicate a current state of an airspace of the air traffic system of interest 164 at a start time of the time period of interest 162.

The merged data may further be combined with the operational context data 126 and the weather data 128 to generate the simulation context 133. Based on the combination of all the data 124-128 and the user input 160, the simulation input files 134 may be generated. The simulation system 120 may use a fast time simulator 140 to perform a simulation of flights over the time period of interest 162 within the air traffic system of interest 164. It should be noted that the system 100 contemplates a modular design, meaning that a machine in which the implementation of the fast time simulator 140 takes place may be independent of a machine in which the collection and processing the data 124-128. This may enable the system 100 to be implemented as a cloud service, where users may avoid direct interaction with the fast time simulator 140, easing the use of the system 100.

The results of the simulation performed by the fast time simulator 140 may be analyzed in a post-processing phase 150 in order to provide information to a user. Outputs that may be generated include a streaming output 152, a relevant operational metrics output 153, an airline or tail performance tracking output 154, and a system status in different time horizons output 155. Other outputs may be generated as well. In some embodiment, one or more of the outputs 152-155 may include a predicted average delay for the air traffic system of interest 164 at a time within the time period of interest 162. In some embodiments, one or more of the outputs 152-155 may include a recommended action to reduce the predicted average delay. The outputs 152-155 may likewise include both a predicted average delay and a recommended action. Other outputs are possible.

The support tools 170 may include tools to assist interested parties in viewing and understanding the data generated by the fast time simulator 140. For example, the support tools 170 may include a virtual radar server 172 to provide a visualization of the streaming output 152. Other support tools 170 are also possible.

The system 100 may enable forecasting delays in real time at any actor (e.g., airports and airlines) involved in Air Traffic Management. It would permit airlines to plan contingency actions to reduce their delay improving their punctuality. It may providing real-time indications of where delays are being accumulated, delay trends, and delay root causes. Airports could benefit from this system by understanding based on the outputs 152-155 which elements (e.g., specific airlines, ground movements, and runway usage) of their airport are provoking delays. The system 100 may provide users (e.g., an airline or the airport) with delay metrics and indicators relevant to the users' operations (e.g., airport/airspace delay, congestion, probability of holding, airport/airspace configuration changes, etc.).

The forecast delay provided by the system 100 may provide airlines with a quantification of the impact of some usual external factors affecting a flight, such as the weather (wind, storms, etc.), changes in airspace configuration (for example, sector closures), and airport congestion. With this information, the airline would be capable of knowing the situation of the air traffic system prior to the departure of its flights or while they are flying, and which situations are likely to influence its trajectory.

Airlines or airports could also use the system 100 to try different possible scenarios (e.g., request specific departure/arrival runway, replan the airways chosen or even the aircraft type) based on the real time data obtained from the feeders and propose their pilots or ANSP with new alternatives to recover from delay. Other advantages may exist.

Figure 2:
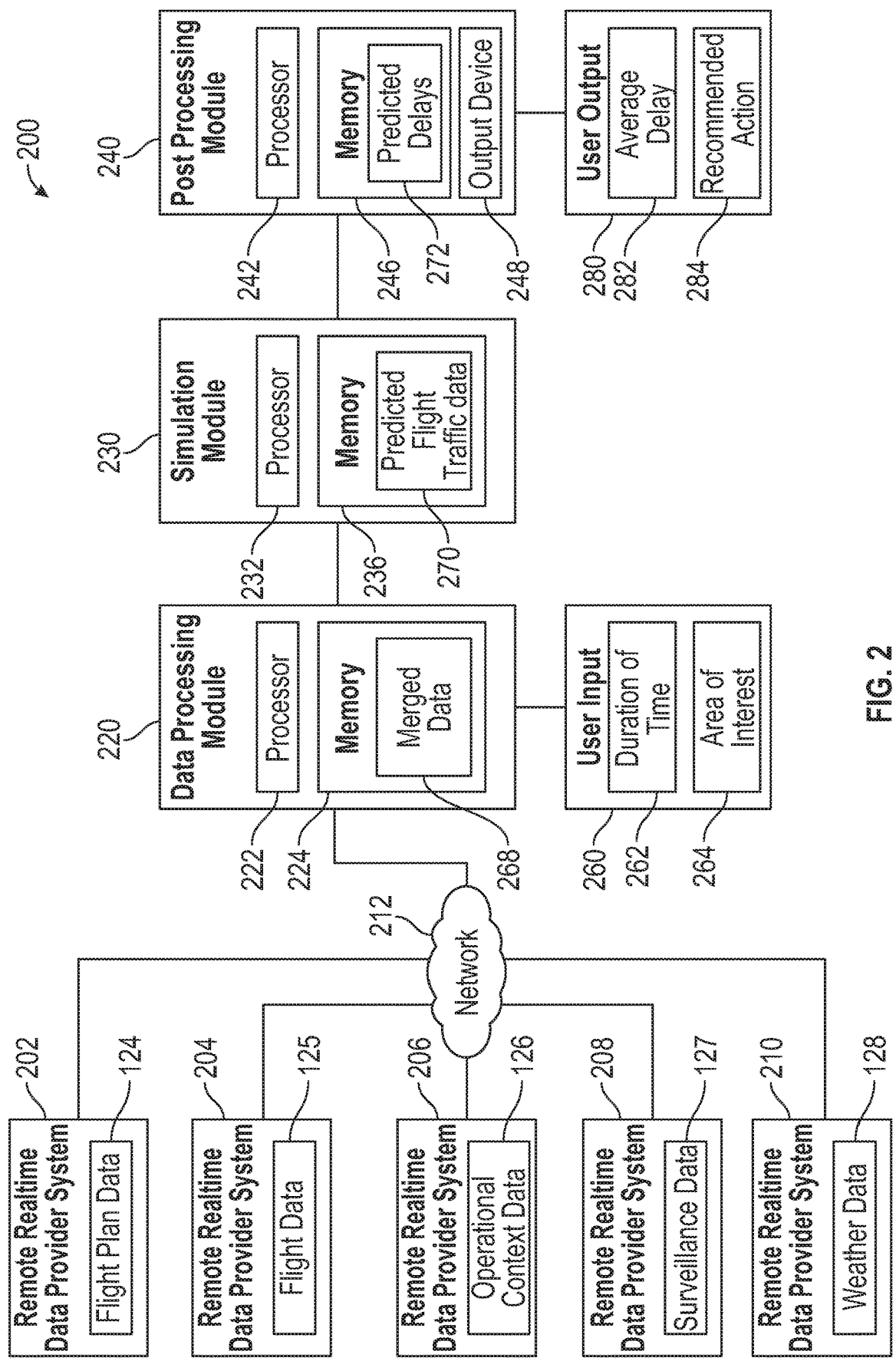
FIG. 2 is a block diagram depicting an embodiment of a system for forecasting flight traffic and delay.

Referring to FIG. 2, an embodiment of a system 200 for forecasting flight traffic and delay is depicted. The system 200 may include a first data provider system 202, a second data provider system 204, a third data provider system 206, a fourth data provider system 208, and a fifth data provider system 210. The first data provider system 202 may include flight plan data 124, the second data provider system 204 may include flight data 125, the third data provider system 206 may include operational context data 126, the fourth data provider system 208 may include surveillance data 127, and the fifth data provider system 210 may include weather data 128. In some embodiments, some of the data provider systems 202-210 may be combined. For example, the flight plan data 124, the flight data 125, and the operational context data 126 may be associated with a single data provider system as shown in FIG. 1. Other combinations are possible.

The system 200 may further include a data processing module 220, a simulation module 230, and a post processing module 240. Although FIG. 2 depicts the modules 220, 230, 240 as distinct, in some embodiments, one or more of the modules 220, 230, 240 may be combined. For example, in some embodiments, the functions described with respect to each of the modules 220, 230, 240 may be performed by a single computing module. As another example, the data processing module 220 and the post processing module 240 may be combined, while the simulation module 230 may be accessed remotely. Other combinations are possible.

Each of the modules 220, 230, 240, may include respective processors and memories. For example, the data processing module 220 may include a first processor 222 and a first memory 224. The simulation module 230 may include a second processor 232 and a second memory 236. The post processing module 240 may include a third processor 242 and a third memory 246. As explained above, in some embodiments, the modules 220, 230, 240 may be combined. For example, each of the functions described with respect to the modules 220, 230, 240 may be performed by a single processor and memory. Other combinations are possible.

The data processing module 220 may be configured to communicate with the data provider systems 202-210 via a network 212. The network 212 may include a local area network (LAN), a wide area network (WAN), another type of private or public network, or combinations thereof. In some embodiments, the network 212 may include the internet.

The post processing module 240 may further include an output device 248 for presenting simulation results to a user. The output device 248 may include a visual display device, such as a screen or monitor, an audio device, such as speakers, another type of output device, or combinations thereof.

During operation, the data processing module 220 may receive the flight plan data 124, the flight data 125, the operational context data 126, the surveillance data 127, and the weather data 128 from the data provider systems 202-210 via the network 212. The data processing module 220 may further receive user input 260 indicating a duration of time 262 and an area of interest 264. The data 124-128 may be filtered based on the duration of time 262 and based on the area of interest 264. As an example, the flight plan data 124 may be limited to flight plans that affect the area of interest 264 during the duration of time 262. Other flight plans included in the flight plan data 124 may be discarded.

Using the flight plan data 124 and the surveillance data 127, the data processing module 220 may generate merged data 268 representing a set of flight portions that remain to be flown, which may be stored at the memory 224. In some embodiments, the flight data 125 may also be used to generate the merged data 268, particularly, in cases where access to the surveillance data 127 may be limited.

The merged data 268, along with the operational context data 126 and the weather data 128 may be sent to the simulation module 230. In some embodiments, the merged data 268, the operational context data 126, and the weather data 128 may be formatted to be compatible with an architecture of the simulation module 230. For example, particular file formats may be used.

The simulation module 230 may receive the merged data 268, the operational context data 126, and the weather data 128, and may generate predicted flight traffic data 270 by performing a simulation of flights over the duration of time 262. The simulation may be based at least partially on the merged data 268, the operational context data 126, and the weather data 128. Further, in some embodiments, multiple simulations may be performed at the simulation module 230 in order to identify a recommendation 284 to improve one or more parameters associated with air traffic in the area of interest 264 and during the duration of time 262. For example, the data processing module 220 or the simulation module 230 may iteratively change a parameter of the operational context data 126 and, for each iteration, calculate predicted delays 272 for a set of flights by performing multiple simulations of the flights over the duration of time 262. In an embodiment, the simulation module 230 may be implemented using a fast time simulation tool.

The post processing module 240 may use the predicted flight traffic data 270 to generate predicted delays 272 associated with an aircraft in the area of interest 264, with a group of aircrafts, with an airport, or other actors associated with the area of interest 264. A user output 280 may be generated. The user output 280 may include an average delay 282 associated with flights in the area of interest 264 over the duration of time 262 and may also identifying a recommendation 284 associated with the parameter selected for iterative change. Other outputs are also possible as will be recognized by persons of ordinary skill in the art having the benefit of this disclosure.

A benefit of the system 100 is that real-time forecasting of delays may be performed with a significant increase of accuracy. While existing air traffic forecasting system may rely only on flight data (air speed, heading, etc.) and weather data at a single airport to provide forecasts, the system 100 enables a more accurate understanding of the sources or delay, including operational context data that is not accounted for by general air traffic forecasting systems. Further, the system may make use of a fast time simulator to make forecasts, which has typically been used for analyzing historical data and not real-time data. Other advantages may exist.

Figure 3:
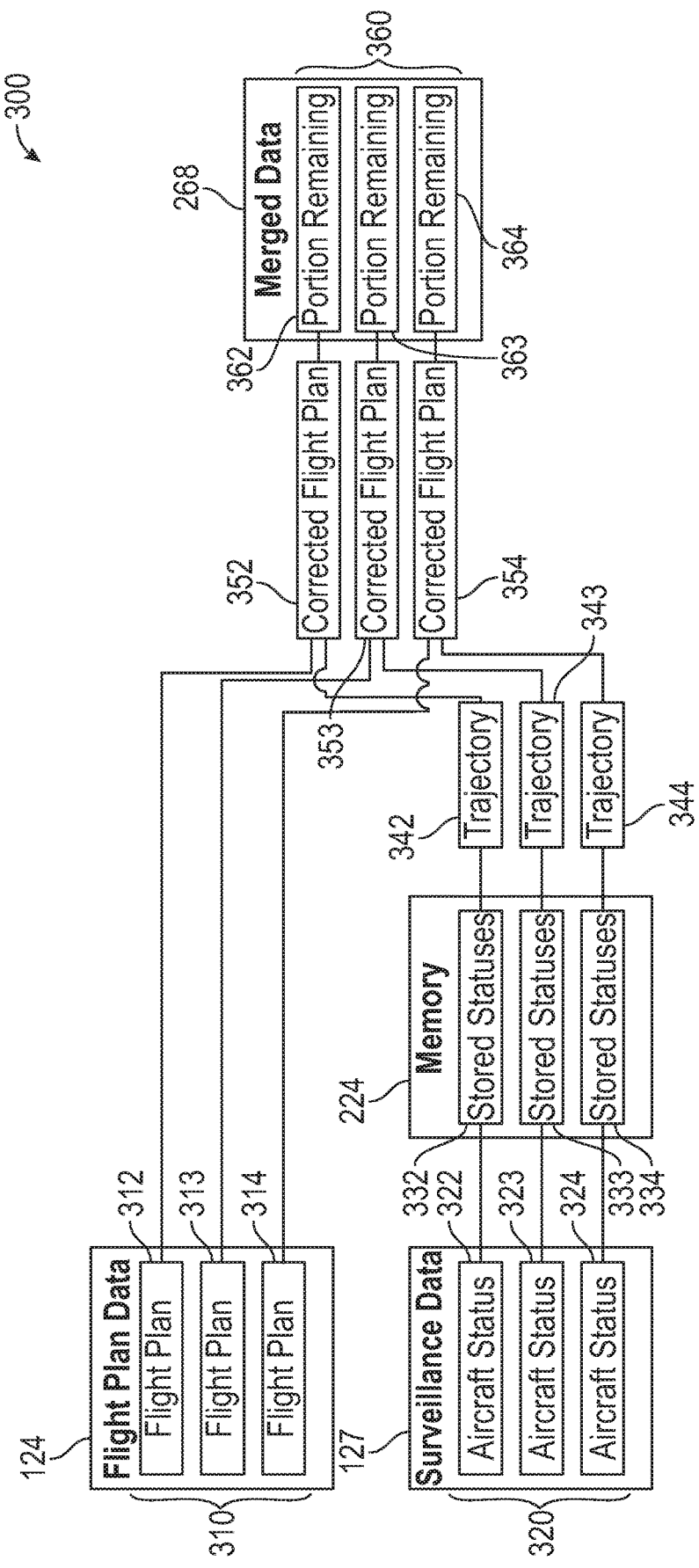
FIG. 3 is a block diagram depicting an embodiment of a system for merging flight plan data and surveillance data.

Referring to FIG. 3, an embodiment of a system 300 for merging flight plan data 124 and surveillance data 127 is depicted. The system 300 may be implemented at the data processing module 220 (shown in FIG. 2) in order to generate the merged data 268.

The merged data 268 may be generated by pairing individual aircraft statuses 322, 323, 324 of a set of aircraft statuses 320 represented by the surveillance data 127 with individual flight plans 312, 313, 314 of a set of current flight plans 310 represented by the flight plan data 124.

In some embodiments, each individual aircraft status 322-324 may be stored at a memory 224 as stored statuses 332, 333, 324. The stored statuses 332-324 may be used to calculate flight trajectories 342, 343, 344 associated with flights. In some embodiments, the individual aircraft statuses 322-324 correspond to one or more ADS-B reports and the one or more ADS-B reports may be used to calculate the flight trajectories 342-344.

The individual flight plans 312-314 may be corrected based on the individual aircraft statuses 322-324, by using the flight trajectories 342-344, to generate corrected flight plans 352-354. Then, trajectory intercept methods may be employed to determine portions 362-364 of the corrected flight plans 352-354 that remain to be flown. The merged data 268 may represent a set of flight portions 360 that remain to be flown.

As explained above, the system 300 may be performed by the data processing module 220 in order to prepare the merged data 268 for simulation. The system 300 is depicted for example purposes only. Additional features and elements may exist to aid in generating the merged data 268 as would be appreciated by persons of skill in the relevant art, having the benefit of this disclosure.

Figure 4:
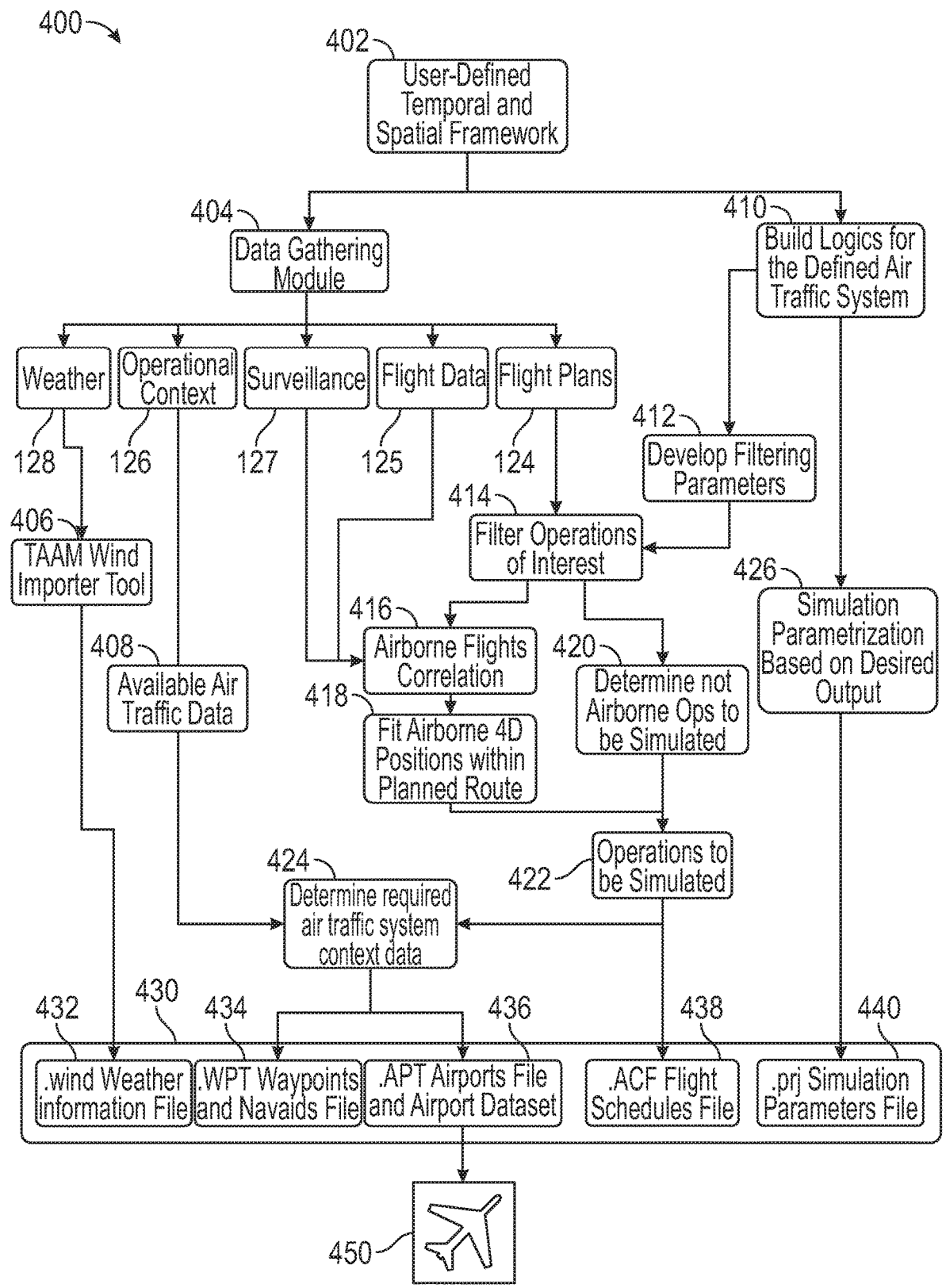
FIG. 4 is a flow diagram depicting an embodiment of a method for forecasting flight traffic.

Referring to FIG. 4, an embodiment of a method 400 for forecasting flight traffic is depicted. The method 400 may include determining a user-defined temporal and spatial framework for simulation, at 402. For example, the user input 260, including the duration of time 262 and the area of interest 264 may be received at the data processing module 220. The area of interest 264 may be associated with an airport terminal, with an airport, with multiple airports, or with a geographical region.

The method 400 may include a data gathering phase, at 404. During the data gathering phase, weather data 128, operational context data 126, surveillance data 127, flight data 125, and flight plan data 124 may be gathered. For example, the data processing module 220 may gather the data 124-128.

The method 400 may include using a total airspace and airport modeler (TAAM) tool to format the weather data 128, at 406, for use with a simulation tool. The method 400 further include determining what air traffic data may be available from the operational context data 126, at 408. For example, in some cases, operational context data 126 may be limited or incomplete. By determining using operational context data 126 when it is available, the accuracy of a forecast may be improved.

Based on the user-defined temporal and spatial framework determined at 402, logics for a defined air traffic system may be built at 410. In other words, the method 400 may determine which airports, aircrafts, and parameters should be included in the simulation. Further, simulation parametrization may be performed, at 426, to determine what output should be generated for display to a user. For example, the parameters of the simulation may depend on whether a user is interested in an average delay for a system, a real-time delay for an aircraft, a recommended action to alleviate delay, etc.

The method 400 may also include developing filtering parameters, at 412. These parameters may be used to filter the flight plan data 124, at 414, resulting in only the flight plans corresponding to the temporal and spatial framework defined at 402 remaining for simulation. Individual flight plans of the flight plan data 124 may then be correlated with the surveillance data 127 and with the flight data 125, at 416. The surveillance data 127 and flight data 125 may then be fit within 4 dimensional positions into the flight plan data, at 418. This may result in merged data representing a set of flight portions that remain to be flown. Further, additional operations (e.g., aircraft type, airports, etc.) may be determined from the flight plan data 124 for simulation, at 420. Based on the merged data generated at 418 and the additional operations determined at 420, a total set of operations to be simulated may be compiled at 422. Based on the available air traffic data determined at 408 and the operations to be simulated determined at 422, required air traffic system context data may be determined at 424.

Each of the simulation inputs may be formatted in a particular file format 430 that is usable by a simulation architecture. For example, the weather data 128 may be formatted as a weather information file 432. The operational context data 126, after being compiled into the air traffic system context data may be formatted as a waypoints and navigational aid file 434, an airports file 436, or both. The merged data representing the operations to be simulated determined at 422 may be formatted as a flight schedule file 438. The simulation parameters determined at 426 may be formatted as a simulation parameters file 440. While these file formats are usable for a fast time simulation tool, other formats may be used with other simulation tools. After the files 432-440 are generated, a simulation may be performed at 450.

Figure 5:
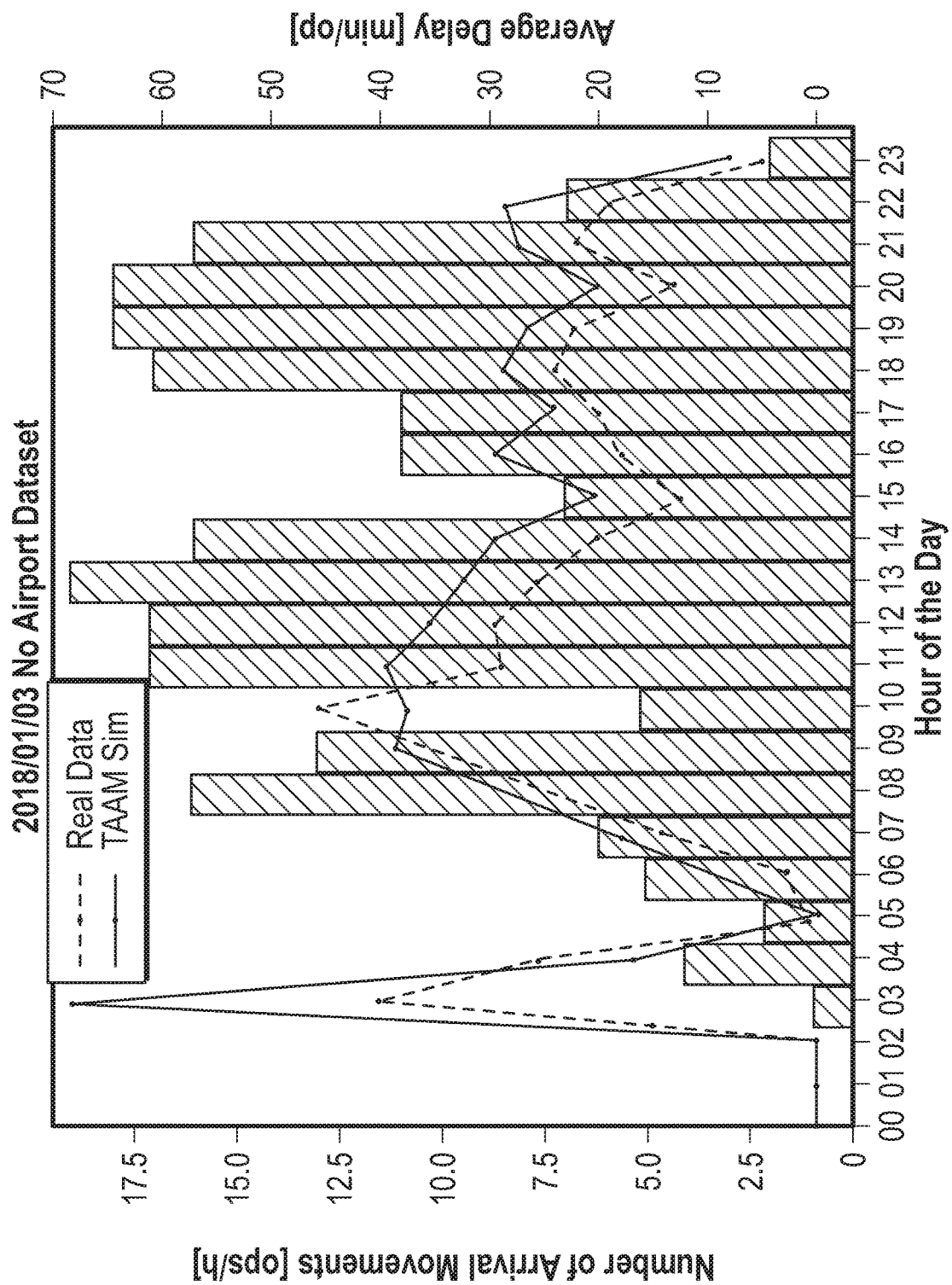
FIG. 5 is a chart depicting a comparison of forecasted flight traffic with actual flight traffic.

Referring to FIG. 5, a chart depicts a comparison of forecasted flight traffic with actual flight traffic for a single day. The x-axis corresponds to each hour of the day. The left axis corresponds to the number of arrival movements and is represented by the bars depicted on the chart. The right axis corresponds to the average delay associated with the arrival movements and is represented by line graphs indicating the real data compared to the simulation data. As can be seen in FIG. 5, the simulation data closely follows the real data. A user having the simulation data ahead of time would be able to detect that for instance at 11 o'clock there is an expected delay at the airport of nearly 40 minutes with respect to the scheduled arrival time. As such, the user would be able to act accordingly.

Figure 6:
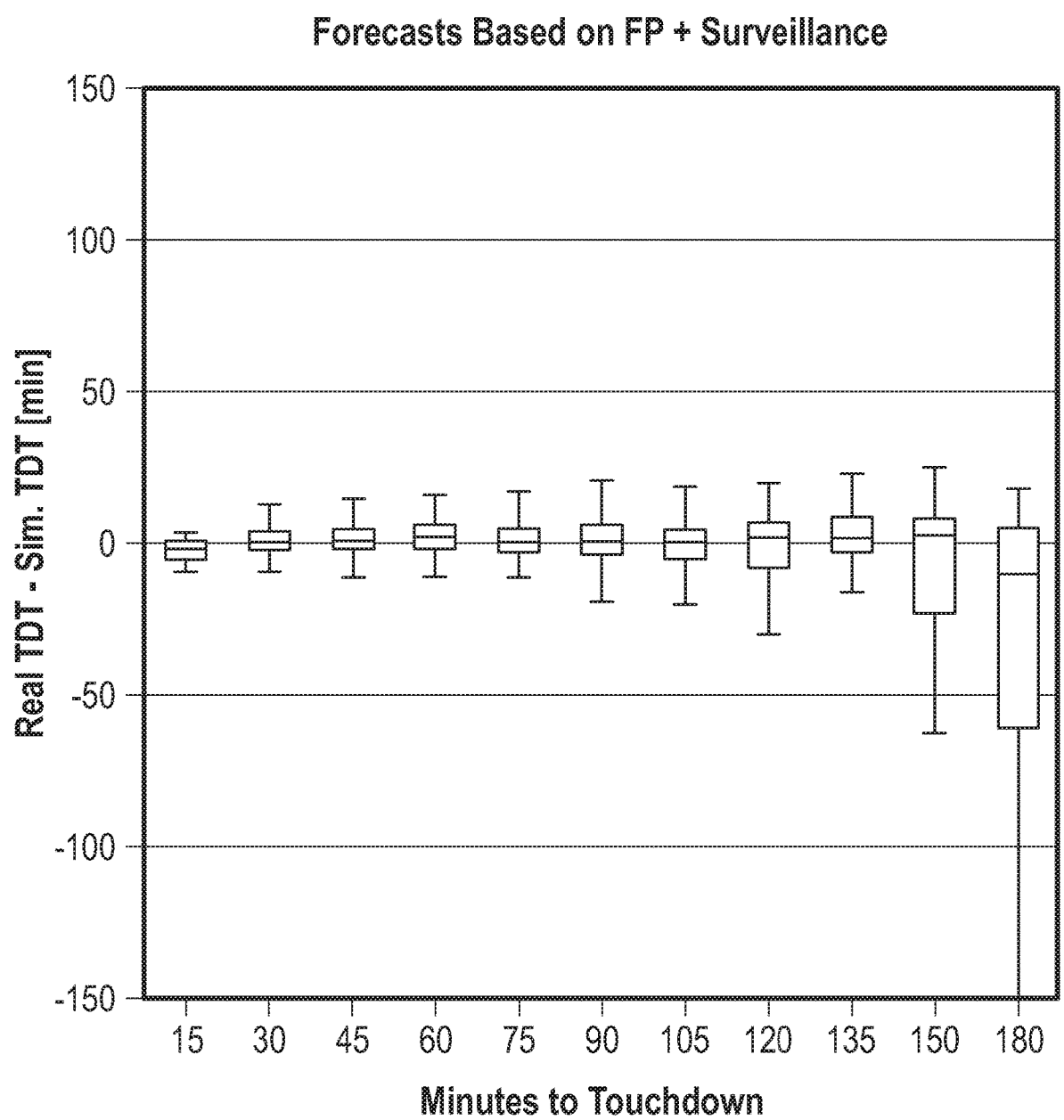
FIG. 6 is a chart depicting the accuracy of delay predictions as a function of time until touchdown of an aircraft.

Referring to FIG. 6, a chart depicts the accuracy of delay predictions produced by the systems and methods described herein as a function of time until touchdown of an aircraft. As shown in FIG. 6, the systems described herein may produce a relatively low delay error, even when making forecasts at 135 minutes before touchdown. Based on this precision, if a delay at an airport is high according to the predictions, for example, an airline might decide to slow down or speed up their aircraft to avoid the saturation at the arrival airport.

Figure 7:
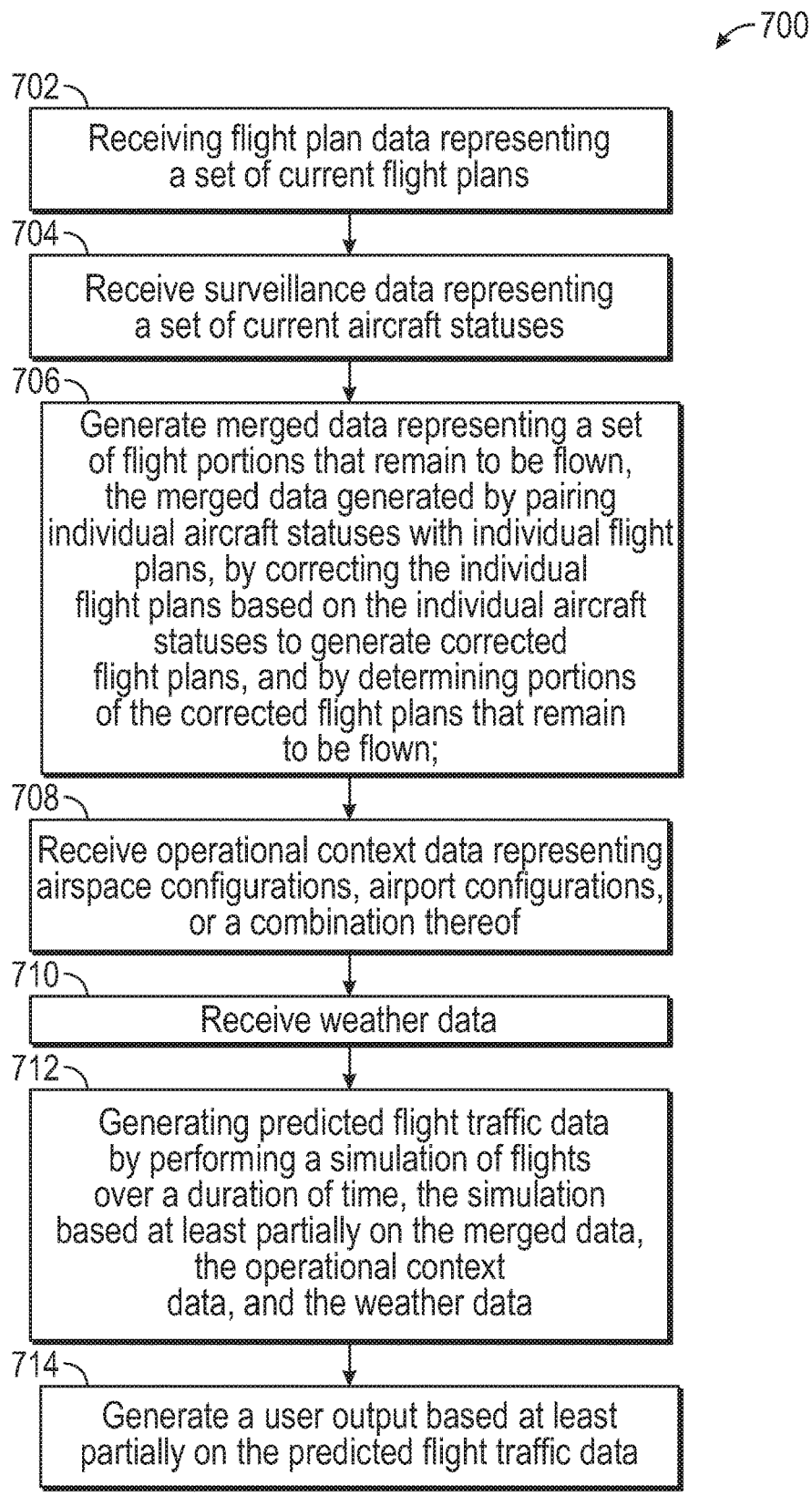
FIG. 7 is a flow diagram depicting an embodiment of a method for forecasting flight traffic.

Referring to FIG. 7, an embodiment of a method 700 for forecasting flight traffic is depicted. The method 700 may include receiving flight plan data representing a set of current flight plans, at 702. For example, the flight plan data 124 may be received at the data processing module 220.

The method 700 may further include receiving surveillance data representing a set of current aircraft statuses, at 704. For example, the surveillance data 127 may be received at the data processing module 220.

The method 700 may also include generating merged data representing a set of flight portions that remain to be flown, at 706. The merged data may be generated by pairing individual aircraft statuses with individual flight plans, by correcting the individual flight plans based on the individual aircraft statuses to generate corrected flight plans, and by determining portions of the corrected flight plans that remain to be flown. For example, the merged data 268 may be generated at the data processing module 220.

The method 700 may include receiving operational context data representing airspace configurations, airport configurations, or a combination thereof, at 708. For example, the operational context data 126 may be received at the data processing module 220.

The method 700 may further include receiving weather data, at 710. For example, the weather data 128 may be received at the data processing module 220.

The method 700 may also include generating predicted flight traffic data by performing a simulation of flights over a duration of time, the simulation based at least partially on the merged data, the operational context data, and the weather data, at 712. For example, the predicted flight traffic data 270 may be generated at the simulation module 230.

The method 700 may include generating a user output based at least partially on the predicted flight traffic data, at 714. For example, the user output 280 may be generated at the post processing module 240.

Figure 8:
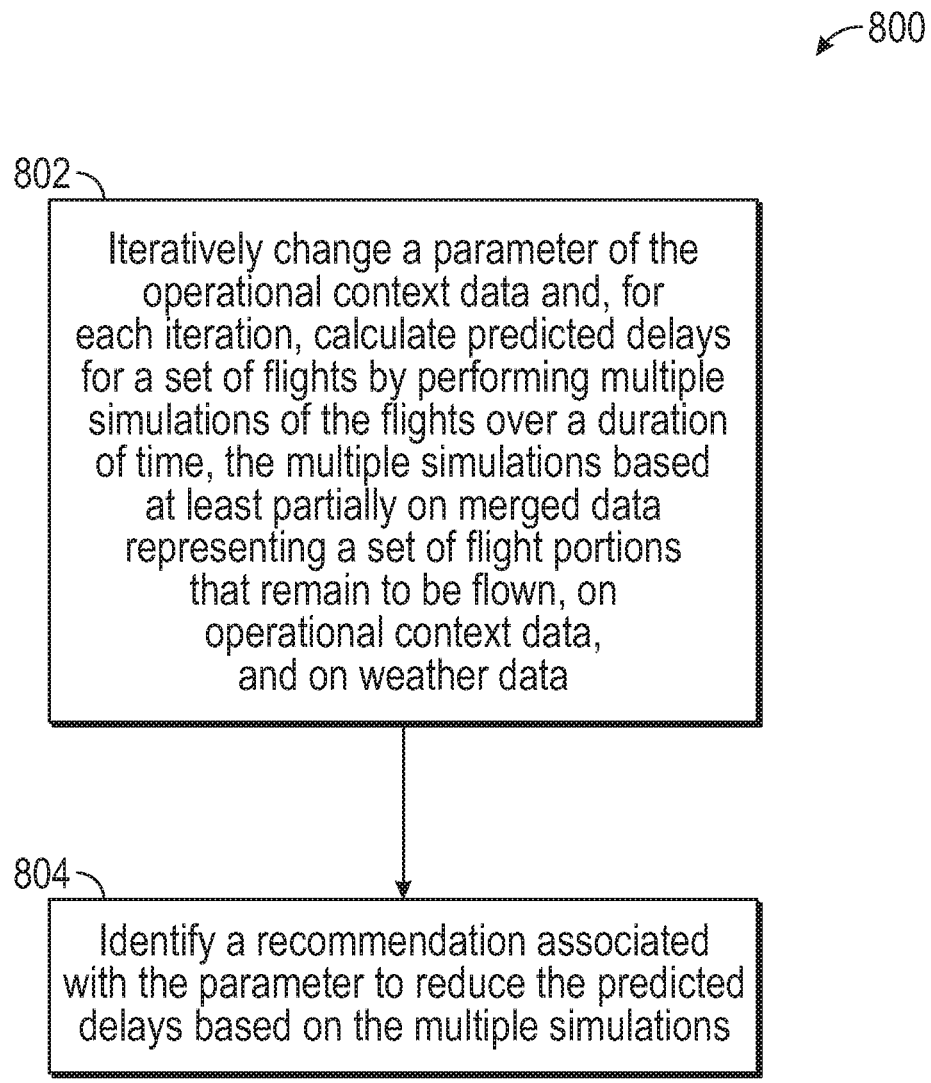
FIG. 8 is a flow diagram depicting an embodiment of a method for identifying a recommendation based on forecasted flight traffic.

Referring to FIG. 8, an embodiment of a method 800 for identifying a recommendation based on forecasted flight traffic is depicted. The method 800 may include iteratively changing a parameter of the operational context data and, for each iteration, calculating predicted delays for a set of flights by performing multiple simulations of the flights over a duration of time, at 802. The multiple simulations may be based at least partially on merged data representing a set of flight portions that remain to be flown, on operational context data, and on weather data. The method 800 may also include identifying a recommendation associated with the parameter to reduce the predicted delays based on the multiple simulations, at 804.

A benefit of the method 800 is that it enables an accurate real-time simulation to be performed to determine a recommended action to reduce delay. Other advantages may exist.

Although various embodiments have been shown and described, the present disclosure is not so limited and will be understood to include all such modifications and variations as would be apparent to one skilled in the art.

What is claimed is:

1. A method comprising:
  receiving flight plan data representing a set of current flight plans;
  receiving surveillance data representing a set of current aircraft statuses;
  generating merged data representing a set of flight portions that remain to be flown, the merged data generated by pairing individual aircraft statuses with individual flight plans, by correcting the individual flight plans based on the individual aircraft statuses to generate corrected flight plans, and by determining portions of the corrected flight plans that remain to be flown;
  receiving operational context data representing airspace configurations, airport configurations, or a combination thereof;
  receiving weather data;
  iteratively changing a parameter of the operational context data and, for each iteration, generating predicted flight traffic data by performing a simulation of flights over a duration of time, the simulation based at least partially on the merged data, the operational context data, and the weather data; and
  generating a user output based at least partially on the predicted flight traffic data, the user output identifying a recommendation associated with the parameter of the operational context data.

2. The method of claim 1, further comprising:
  receiving user input indicating the duration of time and an area of interest; and
  filtering the set of current flight plans based on the duration of time and based on the area of interest.

3. The method of claim 2, wherein the area of interest is associated with an airport terminal, with an airport, with multiple airports, or with a geographical region.

4. The method of claim 1, wherein each flight plan of the set of current flight plans includes an indication of a route to be followed, an aircraft type, an origin-destination pair, an estimated time of departure, an estimated time of arrival, or any combinations thereof.

5. The method of claim 1, wherein the surveillance data includes automatic dependent surveillance-broadcast (ADS-B) reports.

6. The method of claim 5, further comprising:
  storing at least one ADS-B report; and
  calculating a flight trajectory based on the ADS-B report, wherein at least one of the corrected flight plans is based on the flight trajectory.

7. The method of claim 1, further comprising:
  formatting the weather data to be compatible with an architecture of the simulation.

8. The method of claim 1, wherein the weather data is formatted as a weather information file, wherein the operational context data is formatted as a waypoints and navigational aid file, an airports file, or both, and wherein the merged data is formatted as a flight schedule file.

9. The method of claim 1, wherein the simulation is performed using a fast time simulation tool.

10. The method of claim 1, wherein the user output includes a predicted average delay for an area of interest at a time within the duration of time, a recommended action to reduce the predicted average delay, or both.

11. A system comprising:
  at least one processor; and
  one or more memory storing instructions that, when executed by the processor, cause the at least one processor to:
    receive flight plan data representing a set of current flight plans;
    receive surveillance data representing a set of current aircraft statuses;
    generate merged data representing a set of flight portions that remain to be flown, the merged data generated by pairing individual aircraft statuses with individual flight plans, by correcting the individual flight plans based on the individual aircraft statuses to generate corrected flight plans, and by determining portions of the corrected flight plans that remain to be flown;
    receive operational context data representing airspace configurations, airport configurations, or a combination thereof; and
    send the merged data and the operational context data to a simulator module configured to iteratively change a parameter of the operational context data and, for each iteration, generate predicted flight traffic data by performing a simulation of flights over a duration of time, the simulation based at least partially on the merged data and the operational context data.

12. The system of claim 11, wherein the instructions further cause the processor to:
  receive weather data; and
  send the operational context data and the weather data to the simulator module.

13. The system of claim 12, wherein the simulator module is configured to:

generate predicted flight traffic data by performing a simulation of flights for a duration of time, the simulation based at least partially on the merged data, the operational context data, and the weather data; and output at least a portion of the predicted flight traffic data to an output device.

14. The system of claim 11, wherein the instructions further cause the processor to:

receive user input indicating a duration of time and an area of interest; and filter the set of current flight plans based on the duration of time and based on the area of interest.

15. The system of claim 11, wherein the instructions further cause the processor to:

store at least one ADS-B report at the memory; and calculate a flight trajectory based on the ADS-B report, wherein at least one of the corrected flight plans is based on the flight trajectory.

16. The system of claim 12, wherein the instructions further cause the processor to:

format the weather data to be compatible with an architecture of the simulator module.

17. A method comprising:

receiving flight plan data representing a set of current flight plans;

receiving surveillance data representing a set of current aircraft statuses;

generating merged data representing a set of flight portions that remain to be flown based on the flight plan data and based on the surveillance data;

receiving operational context data representing an airspace configuration, an airport configuration, or a combination thereof;

receiving weather data;

iteratively changing a parameter of the operational context data and, for each iteration, calculating predicted delays for a set of flights by performing multiple simulations of the set of flights over a duration of time, the multiple simulations based at least partially on the merged data, the operational context data, and the weather data; and identifying a recommendation associated with the parameter to reduce the predicted delays based on the multiple simulations.

18. The method of claim 17, further comprising:

receiving user input indicating the duration of time and an area of interest; and filtering the set of current flight plans based on the duration of time and based on the area of interest.

19. The method of claim 18, wherein the area of interest is associated with an airport terminal, with an airport, with multiple airports, or with a geographical region.

20. The method of claim 17, further comprising:

generating a user output including a predicted average delay for an area of interest at a time within the duration of time.

* * * * *